United States Patent
Yang et al.

(10) Patent No.: US 10,217,934 B2
(45) Date of Patent: Feb. 26, 2019

(54) METHOD FOR MANUFACTURING MAGNETIC MEMORY CELLS

(71) Applicant: Avalanche Technology, Inc., Fremont, CA (US)

(72) Inventors: Hongxin Yang, Newark, CA (US); Dong Ha Jung, Pleasanton, CA (US); Jing Zhang, Los Altos, CA (US); Bing K. Yen, Cupertino, CA (US)

(73) Assignee: Avalanche Technology, Inc., Fremont, CA (US)

( * ) Notice: Subject to any disclaimer, the term of this patent is extended or adjusted under 35 U.S.C. 154(b) by 0 days.

(21) Appl. No.: 16/112,173

(22) Filed: Aug. 24, 2018

(65) Prior Publication Data
US 2018/0366642 A1    Dec. 20, 2018

Related U.S. Application Data

(62) Division of application No. 15/618,510, filed on Jun. 9, 2017.

(51) Int. Cl.
| | |
|---|---|
| *H01L 43/12* | (2006.01) |
| *G11C 11/16* | (2006.01) |
| *H01L 27/22* | (2006.01) |
| *H01L 43/08* | (2006.01) |

(52) U.S. Cl.
CPC ............ *H01L 43/12* (2013.01); *G11C 11/161* (2013.01); *H01L 27/224* (2013.01); *H01L 43/08* (2013.01)

(58) Field of Classification Search
CPC ............... H01L 27/115; H01L 27/2436; H01L 27/2409; H01L 45/16; H01L 45/144; H01L 45/1233; H01L 45/06; H01L 45/126; H01L 27/11521; G11C 2211/5615; G11C 11/161
See application file for complete search history.

(56) References Cited

U.S. PATENT DOCUMENTS

| | | | |
|---|---|---|---|
| 2009/0141543 A1 | 6/2009 | Ho et al. | |
| 2011/0044096 A1 | 2/2011 | Li | |
| 2011/0235217 A1* | 9/2011 | Chen | H01L 43/08 360/324.2 |
| 2014/0209892 A1 | 7/2014 | Kuo et al. | |

(Continued)

*Primary Examiner* — Mohammed R Alam
(74) *Attorney, Agent, or Firm* — Bing K. Yen

(57) ABSTRACT

The present invention is directed to a method for manufacturing a memory cell that includes a magnetic memory element electrically connected to a two-terminal selector. The method includes the steps of depositing a selector film stack on a substrate; depositing a magnetic memory element film stack on top of the selector film stack; etching the magnetic memory element film stack with an etch mask formed thereon to remove at least an insulating tunnel junction layer in the magnetic memory element film stack not covered by the etch mask, thereby forming a magnetic memory element pillar; depositing a first conforming dielectric layer over the magnetic memory element pillar, including a sidewall thereof, and surrounding surface; etching a portion of the first conforming dielectric layer covering the surrounding surface to form a first protective sleeve around at least the insulating tunnel junction layer of the magnetic memory element pillar; and etching the selector film stack using the etch mask and the first protective sleeve as a composite mask to form a memory cell pillar.

11 Claims, 13 Drawing Sheets

(56) References Cited

U.S. PATENT DOCUMENTS

2016/0005461 A1* 1/2016 Jo .................. G11C 29/026
365/148
2016/0020250 A1 1/2016 Li et al.

* cited by examiner

METHOD FOR MANUFACTURING MAGNETIC MEMORY CELLS

CROSS-REFERENCE TO RELATED APPLICATIONS

The present application is a divisional application of the commonly assigned application bearing Ser. No. 15/618,510, filed on Jun. 9, 2017 and entitled "Method for Manufacturing Magnetic Memory Cells," the content of which is incorporated by reference herein in its entirety.

BACKGROUND

The present invention relates to magnetic memory, and more particularly, to a magnetic memory cell structure and a method for manufacturing the same.

A resistance-based memory device normally comprises an array of memory cells, each of which includes a memory element and a selection element coupled in series between two electrodes. The selection element functions like a switch to direct current or voltage through the selected memory element coupled thereto. The selection element may be a three-terminal device, such as transistor, or a two-terminal device, such as diode or Ovonic threshold switch. Upon application of an appropriate voltage or current to the selected memory element, the electrical property of the memory element would change accordingly, thereby switching the stored logic in the respective memory cell.

FIG. 1 is a schematic circuit diagram of a memory array 30, which comprises a plurality of memory cells 32 with each of the memory cells 32 including a two-terminal bi-directional selector 34 coupled to a resistance-based memory element 36 in series; a first plurality of parallel conductive lines 38 with each being coupled to a respective row of the two-terminal bi-directional selectors 34 in a first direction; and a second plurality of parallel conductive lines 40 with each being coupled to a respective row of the memory elements 36 in a second direction substantially perpendicular to the first direction. Accordingly, the memory cells 32 are located at the cross points between the first and second plurality of conductive lines 38 and 40. The first and second plurality of conductive lines 38 and 40 may be bit lines and word lines, respectively, or vice versa. Multiple layers of the memory array 30 may be stacked to form a monolithic three-dimensional memory device.

The resistance-based memory element 36 may be classified into at least one of several known groups based on their resistance switching mechanism. The memory element of Phase Change Random Access Memory (PCRAM) may comprise a phase change chalcogenide compound, which can switch between a resistive phase (amorphous or crystalline) and a conductive crystalline phase. The memory element of Conductive Bridging Random Access Memory (CBRAM) relies on the statistical bridging of metal rich precipitates therein for its switching mechanism. The memory element of CBRAM normally comprises a nominally insulating metal oxide material, which can switch to a lower electrical resistance state as the metal rich precipitates grow and link to form conductive paths upon application of an appropriate voltage. The memory element of Magnetic Random Access Memory (MRAM) typically comprises at least two layers of ferromagnetic materials with an insulating tunnel junction layer interposed therebetween. When a switching current is applied to the memory element of an MRAM device, one of the ferromagnetic layers will switch its magnetization direction with respect to that of the other magnetic layer, thereby changing the electrical resistance of the element.

A magnetic memory element normally includes a magnetic reference layer and a magnetic free layer with an electron tunnel junction layer interposed therebetween. The magnetic reference layer, the electron tunnel junction layer, and the magnetic free layer collectively form a magnetic tunneling junction (MTJ). Upon the application of an appropriate current through the MTJ, the magnetization direction of the magnetic free layer can be switched between two directions: parallel and anti-parallel with respect to the magnetization direction of the magnetic reference layer. The electron tunnel junction layer is normally made of an insulating material with a thickness ranging from a few to a few tens of angstroms. When the magnetization directions of the magnetic free and reference layers are substantially parallel or oriented in a same direction, electrons polarized by the magnetic reference layer can tunnel through the insulating tunnel junction layer, thereby decreasing the electrical resistance of the MTJ. Conversely, the electrical resistance of the MTJ is high when the magnetization directions of the magnetic reference and free layers are substantially anti-parallel or oriented in opposite directions. The stored logic in the magnetic memory element can be switched by changing the magnetization direction of the magnetic free layer between parallel and anti-parallel with respect to the magnetization direction of the reference layer. Therefore, the MTJ has two stable resistance states that allow the MTJ to serve as a non-volatile memory element.

Based on the relative orientation between the magnetic reference and free layers and the magnetization directions thereof, an MTJ can be classified into one of two types: in-plane MTJ, the magnetization directions of which lie substantially within planes parallel to the same layers, or perpendicular MTJ, the magnetization directions of which are substantially perpendicular to the layer planes.

The two-terminal bi-directional selector 34 normally includes two electrodes with a switching layer interposed therebetween. The switching layer is insulative in the absence of an applied voltage or voltage bias to the selector 34. When a sufficiently high voltage is applied to the selector 34, however, the switching layer becomes conductive and thus allows current to flow therethrough.

FIG. 2 illustrates the formation of a magnetic memory cell 32 by a conventional manufacturing method. The magnetic memory cell 32 includes a selector 34 and a magnetic memory element 36 coupled in series. The selector 34 includes a top electrode 42 and a bottom electrode 44 with a switching layer 46 interposed therebetween. The magnetic memory element 36 includes a magnetic tunnel junction (MTJ) structure 48 between an optional seed layer 50 and an optional cap layer 52. The selector 34 is formed on top of the magnetic memory element 36, which is formed on top of the first conductive line 40 (bit or word line).

With continuing reference to FIG. 2, the fabrication of the magnetic memory cell 32 begins by depositing all relevant films of the magnetic memory element 36 and the selector 34 on a planarized substrate containing therein the first conductive line 40. The pillar shaped magnetic memory cell 32 is then formed by etching the relevant films with an etch mask 52 thereon. The etching process can carried out by plasma etching or ion beam etching. Because of the weak etching resistance of the switching layer 46 compared with other layers in the magnetic memory cell 32 and the prolonged exposure of the switching layer 46 to the etching environment, the sidewall of the switching layer 46 tend to recede from the sidewalls of the adjacent layers, thereby creating a circumferential notch or cavity on the pillar shaped magnetic memory cell 32. During the etching process, re-deposited materials, such as magnetic materials in the MTJ structure 48 and noble metals in the top and bottom electrodes 42 and 44 that cannot be readily volatized, accumulate in the circumferential notch, thereby shunting the selector 34.

For the foregoing reasons, there is a need for a manufacturing method that can reliably produce magnetic memory cells with high yield.

SUMMARY

The present invention is directed to a method that satisfies this need. A method having features of the present invention for manufacturing a memory cell, which includes a magnetic memory element electrically connected to a two-terminal selector, includes the steps of depositing a magnetic memory element film stack on a substrate; depositing a selector film stack on top of the magnetic memory element film stack; etching the selector film stack with an etch mask formed thereon to remove at least a switching layer in the selector film stack not covered by the etch mask, thereby forming a selector pillar; depositing a first conforming dielectric layer over the selector pillar, including a sidewall thereof, and surrounding surface; etching a portion of the first conforming dielectric layer covering the surrounding surface to form a first protective sleeve around at least the switching layer of the selector pillar; and etching the magnetic memory element film stack using the etch mask and the first protective sleeve as a composite mask to form a memory cell pillar.

According to another aspect of the present invention, a method for manufacturing a memory cell, which includes a magnetic memory element electrically connected to a two-terminal selector, includes the steps of depositing a selector film stack on a substrate; depositing a magnetic memory element film stack on top of the selector film stack; etching the magnetic memory element film stack with an etch mask formed thereon to remove at least an insulating tunnel junction layer in the magnetic memory element film stack not covered by the etch mask, thereby forming a magnetic memory element pillar; depositing a first conforming dielectric layer over the magnetic memory element pillar, including a sidewall thereof, and surrounding surface; etching a portion of the first conforming dielectric layer covering the surrounding surface to form a first protective sleeve around at least the insulating tunnel junction layer of the magnetic memory element pillar; and etching the selector film stack using the etch mask and the first protective sleeve as a composite mask to form a memory cell pillar.

BRIEF DESCRIPTION OF THE DRAWINGS

These and other features, aspects, and advantages of the present invention will become better understood with regard to the following description, appended claims, and accompanying drawings where:

For purposes of clarity and brevity, like elements and components will bear the same designations and numbering throughout the Figures, which are not necessarily drawn to scale.

DETAILED DESCRIPTION

Figure 1:
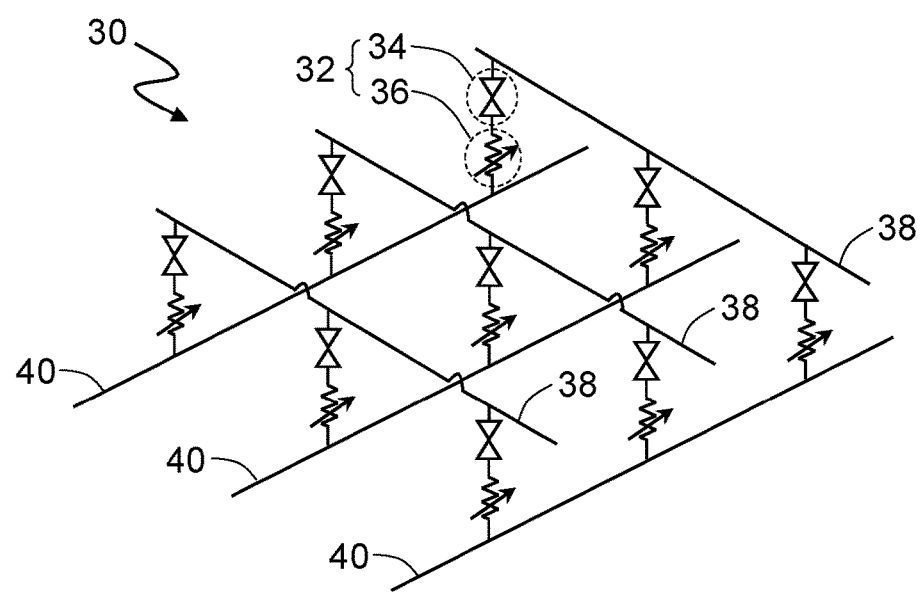
FIG. 1 is a schematic circuit diagram for an array of memory cells with each memory cell including a resistance-based memory element and a two-terminal selector coupled in series.
Figure 2:
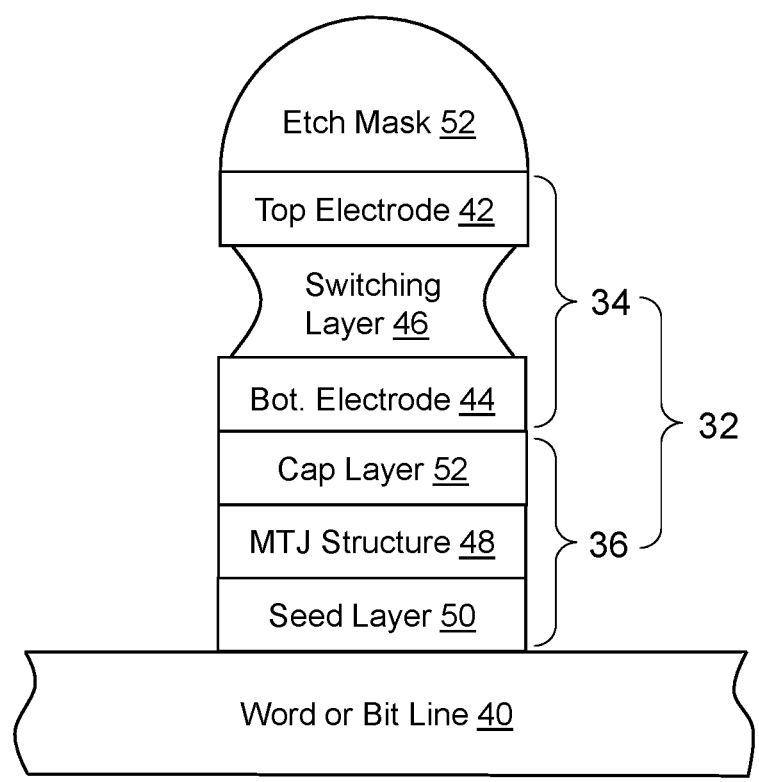
FIG. 2 is a cross sectional view of a memory cell pillar fabricated by a conventional manufacturing process.

In the Summary above and in the Detailed Description, and the claims below, and in the accompanying drawings, reference is made to particular features (including method steps) of the invention. It is to be understood that the disclosure of the invention in this specification includes all possible combinations of such particular features. For example, where a particular feature is disclosed in the context of a particular aspect or embodiment of the invention, or a particular claim, that feature can also be used, to the extent possible, in combination with and/or in the context of other particular aspects and embodiments of the invention, and in the invention generally.

Where reference is made herein to a material AB composed of element A and element B, the material AB can be an alloy, a compound, or a combination thereof, except where the context excludes that possibility.

Where reference is made herein to a method comprising two or more defined steps, the defined steps can be carried out in any order or simultaneously except where the context excludes that possibility, and the method can include one or more other steps which are carried out before any of the defined steps, between two of the defined steps, or after all the defined steps except where the context excludes that possibility.

The term "noncrystalline" means an amorphous state or a state in which fine crystals are dispersed in an amorphous matrix, not a single crystal or polycrystalline state. In case of state in which fine crystals are dispersed in an amorphous matrix, those in which a crystalline peak is substantially not observed by, for example, X-ray diffraction can be designated as "noncrystalline."

The term "magnetic dead layer" means a layer of supposedly ferromagnetic material that does not exhibit a net magnetic moment in the absence of an external magnetic field. A magnetic dead layer of several atomic layers may form in a magnetic film in contact with another layer material owing to intermixing of atoms at the interface. Alternatively, a magnetic dead layer may form as thickness of a magnetic film decreases to a point that the magnetic film becomes superparamagnetic.

The term "at least" followed by a number is used herein to denote the start of a range beginning with that number, which may be a range having an upper limit or no upper limit, depending on the variable being defined. For example, "at least 1" means 1 or more than 1. The term "at most" followed by a number is used herein to denote the end of a range ending with that number, which may be a range having 1 or 0 as its lower limit, or a range having no lower limit, depending upon the variable being defined. For example, "at most 4" means 4 or less than 4, and "at most 40%" means 40% or less than 40%. When, in this specification, a range is given as "a first number to a second number" or "a first number-a second number," this means a range whose lower limit is the first number and whose upper limit is the second number. For example, "25 to 100 nm" means a range whose lower limit is 25 nm and whose upper limit is 100 nm.

Figure 3:
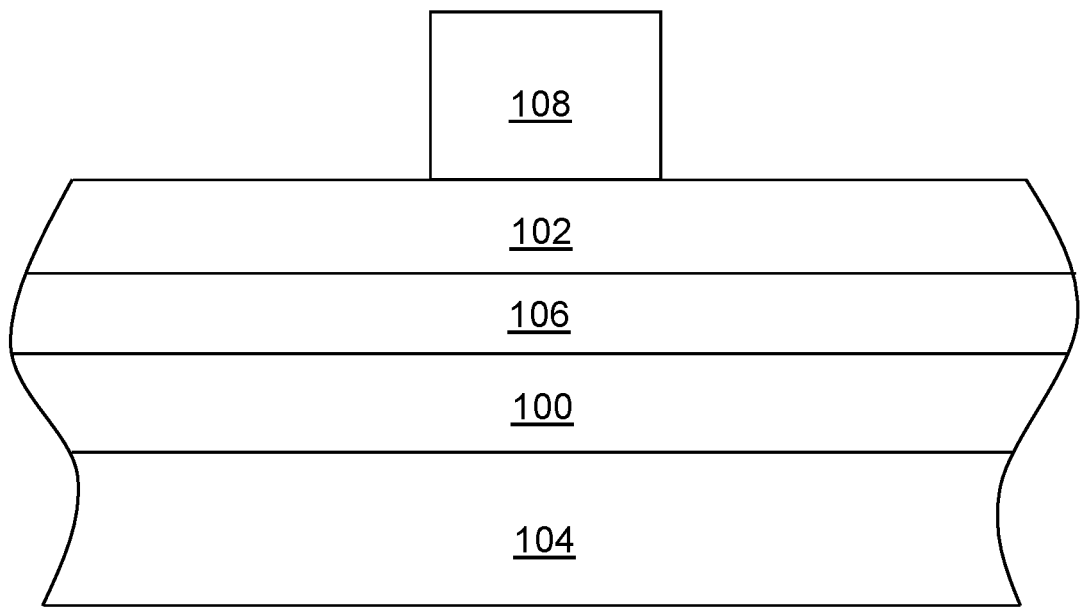
FIGS. 3-11 are cross sectional views illustrating various stages in formation of a memory cell in accordance with a method embodiment of the present invention.

An embodiment of the present invention as applied to formation of a magnetic memory cell will now be described with reference to FIGS. 3-11. Referring now to FIG. 3, the process begins by first depositing a magnetic memory element film stack 100 on top of a substrate containing therein patterned first conductive lines 104 extending along a first direction. The magnetic memory element films stack 100 includes at least two magnetic layers with an insulating tunnel junction layer interposed therebetween (not shown). A selector film stack 102 is then deposited on top of the magnetic memory element film stack 100. The selector film stack 102 includes two electrode layers with a switching layer interposed therebetween (not shown). An optional intermediate electrode film stack 106 may be inserted between the magnetic memory element films stack 100 and the selector film stack 102. The films stacks 100, 102, and 106 may be deposited by a physical vapor deposition (PVD) process (e.g., sputtering) or a chemical vapor deposition (CVD) process (e.g., plasma-enhanced CVD, atomic layer deposition (ALD)) or a combination of both.

With continuing reference to FIG. 3, an etch mask 108 is formed on top of the selector film stack 102, directly above one of the first conductive lines 104. The etch mask 108 may include one or more layers of mask materials, such as but not limited to photoresist, silicon oxide, silicon nitride, silicon oxynitride, silicon carbide, tantalum, tantalum nitride, tungsten, titanium nitride, and any combinations thereof. The etch mask 108 may be formed by photolithography or a combination of photolithography and etching.

Figure 4:
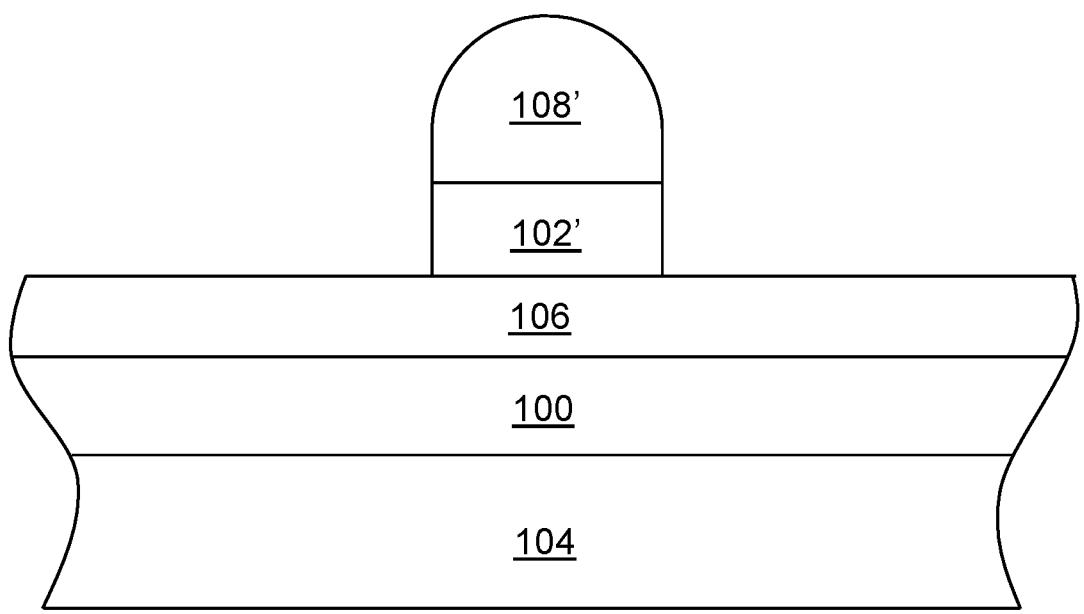

The process continues by etching the selector film stack 102 with the etch mask 108 thereon to form a patterned selector 102', as illustrated in FIG. 4. The etching of the selector film stack 102 may be carried out by a plasma etching process or an ion beam etching process or a combination of both. The etching process may stop after exposing the magnetic memory element films stack 100 or the optional intermediate electrode film stack 106.

Figure 5:
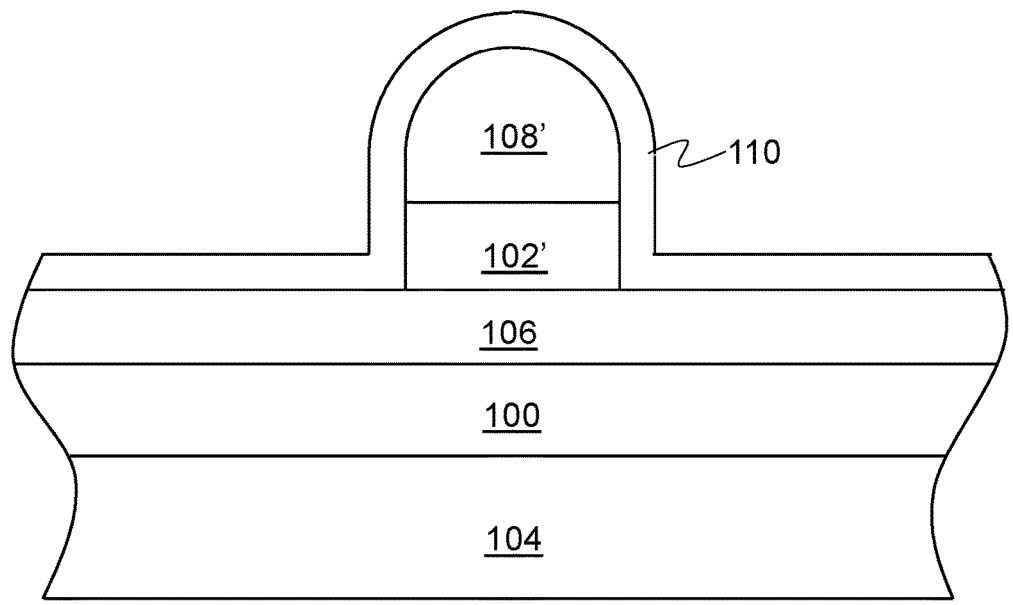

After the formation of the selector 102', a first conformal protective layer 110 may be deposited on top of the optional intermediate electrode film stack 106 and encapsulates the pillar comprising the selector 102' and the etch mask 108' thereabove as shown in FIG. 5. When the optional intermediate electrode film stack 106 is not present, the first protective layer 110 may be deposited on top of the exposed magnetic memory element films stack 100. The first protective layer 110 may be made of any suitable dielectric material such as but not limited to silicon oxide, silicon nitride, silicon oxynitride, hafnium oxide, zirconium oxide, aluminum oxide, or any combination thereof. The first protective layer 110 may be deposited by a conformal coating method, such as but not limited to PECVD or ALD, to ensure the complete sidewall coverage of the selector 102'.

Figure 6:
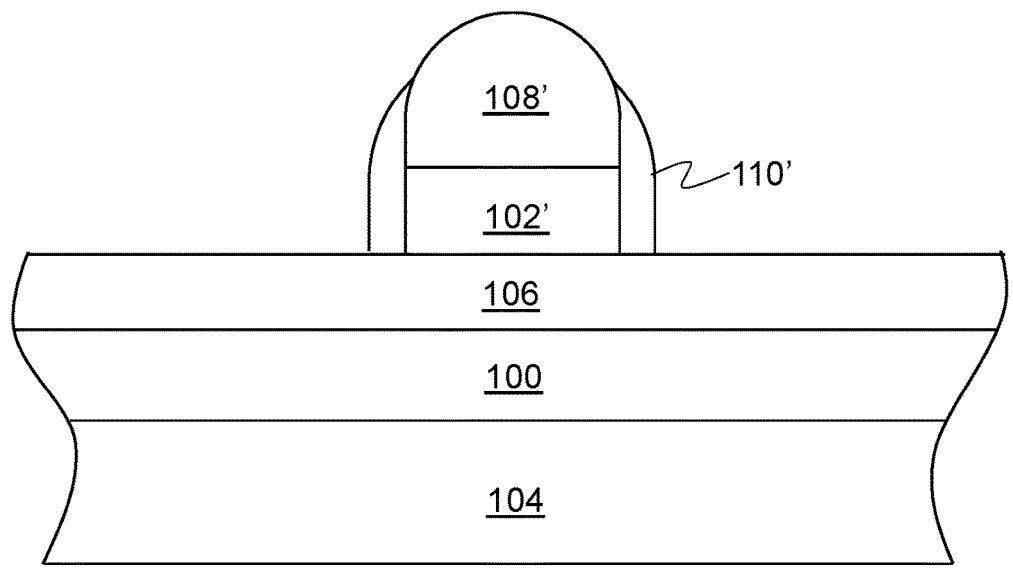

Following the deposition of the first protective layer 110, most of the first protective layer 110 covering the top of the etch mask 108' and the optional intermediate electrode film stack 106 or the magnetic memory element films stack 100 is removed by a vertical etching process, while leaving a portion of the first protective layer 110 surrounding the sidewall of the selector 102' intact, thereby forming a first sidewall sleeve 110' as illustrated in FIG. 6. The vertical etching process of the first protective layer 110 may be carried out by a plasma etching process or an ion beam etching process or a combination of both processes. The first protective sleeve 110' prevents the accumulation of re-deposited materials on the sidewall of the switching layer of the selector 102' in subsequent etching steps.

Figure 7:
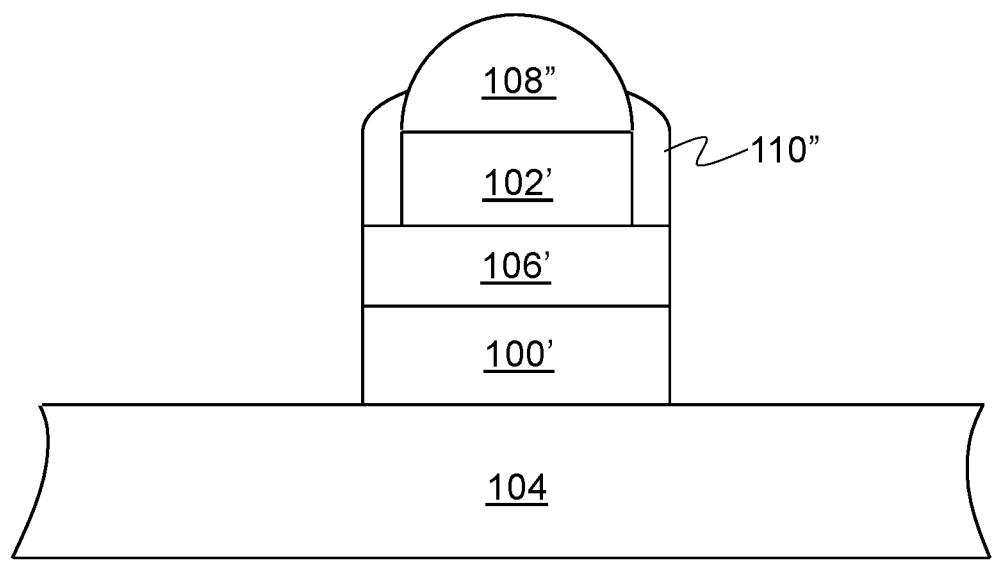

After the formation of the first protective sleeve 110' around the sidewall of the selector 102', the optional intermediate electrode film stack 106 (if present) and the magnetic memory element films stack 100 are etched using the etch mask 108' and the first protective sleeve 110' as a composite mask to form a memory cell pillar that includes a magnetic memory element 100' formed on top of the first conductive line 104, an optional intermediate electrode 106' formed on top of the magnetic memory element 100', the selector 102' and the first protective sleeve 110" surrounding the selector 102' formed on top of the optional intermediate electrode 106', and the etch mask 108" disposed on top of the selector 102', as shown in FIG. 7. The selector 102' and the first protective sleeve 110" would form on top of the magnetic memory element 100' in the absence of the optional intermediate electrode 106'. The etching process exposes the substrate and the first conductive line 104 embedded therein not covered by the composite mask and may be carried out by a plasma etching process or an ion beam etching process or a combination of both processes. The etching step for forming the memory cell pillar may be combined with the previous etching step of forming the first protective sleeve 110' into one etching step.

Figure 8:
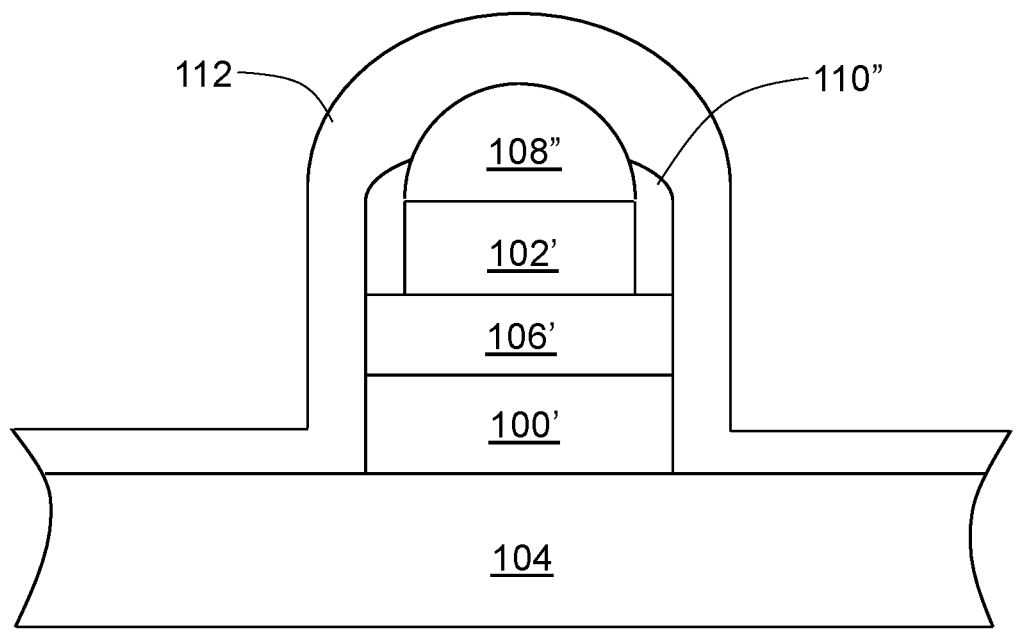

Following the formation of the memory cell pillar illustrated in FIG. 7, a second conformal protective layer 112 is deposited on top of the substrate and the first conductive line 104 embedded therein and encapsulates the memory cell pillar, including the sidewall thereof, as illustrated in FIG. 8. Accordingly, the peripheral sidewalls of the magnetic memory element 100' and the optional intermediate electrode 106' and the outer sidewall of the first protective sleeve 110" are surrounded by a second protective sleeve formed by the second protective layer 112. The second protective layer 112 may be made of any suitable dielectric material such as but not limited to silicon oxide, silicon nitride, silicon oxynitride, hafnium oxide, zirconium oxide, aluminum oxide, or any combination thereof. The second protective layer 112 may be deposited by a conformal coating method, such as but not limited to PECVD or ALD, to ensure the complete sidewall coverage of the memory cell pillar.

Figure 9:
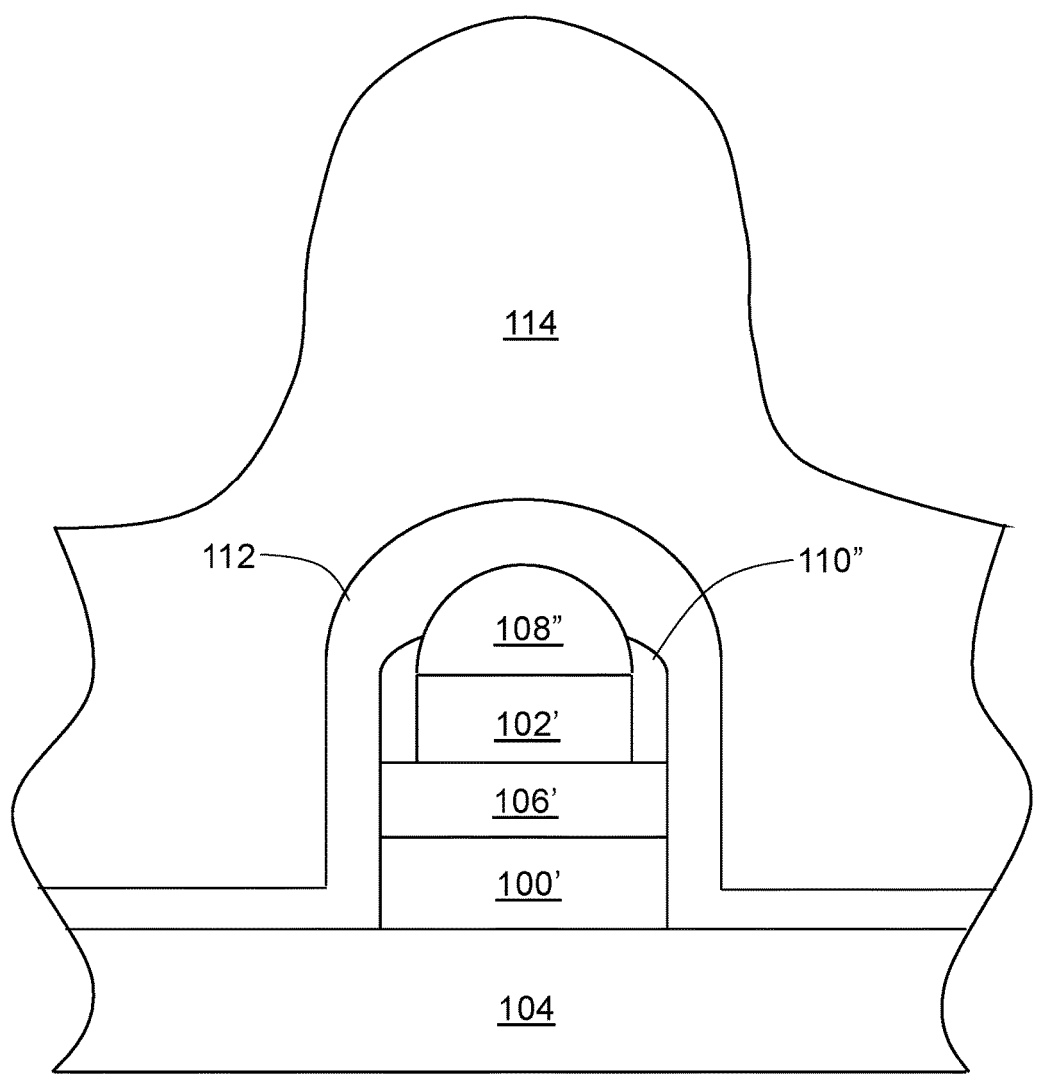

After the deposition of the second protective layer 112, a first dielectric material 114 is deposited onto the substrate, the first conductive line 104 embedded therein, and the memory cell pillar covered with the second protective layer 112 as illustrated in FIG. 9. The deposited first dielectric material 114 should be sufficiently thick to allow a planarization process to remove excess first dielectric material above the etch mask 108". The first dielectric material 114 may be made of silicon oxide, silicon nitride, silicon oxynitride, or any dielectric material with a suitably small dielectric constant, such as but not limited to fluorine-doped silicon oxide, carbon-doped silicon oxide, or porous silicon. The first dielectric material 114 may be deposited by a PVD process such as sputtering or a CVD process such as plasma-enhanced CVD or ALD.

Figure 10:
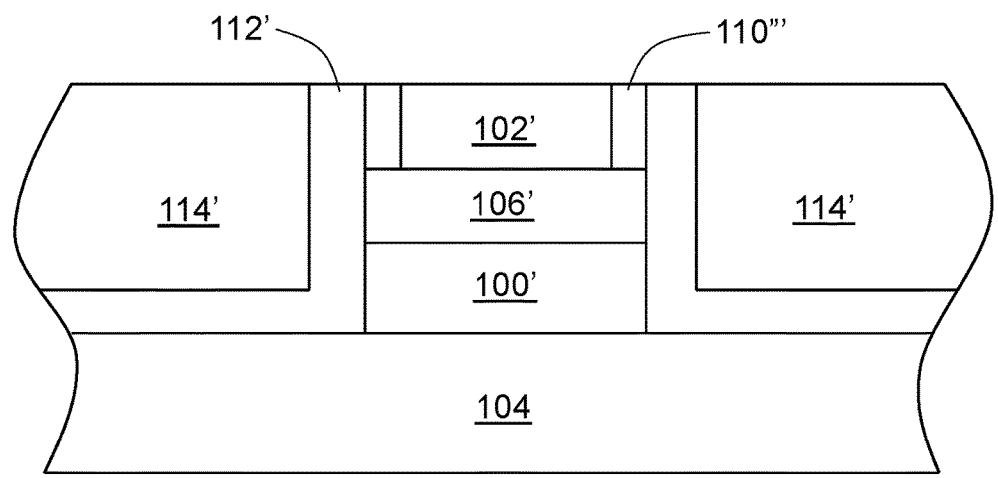

Following the deposition of the first dielectric material 114, the excess first dielectric material 114 above the selector 102' is removed by a planarization process as shown in FIG. 10, thereby forming a first interlayer dielectric (ILD) 114'. The etch mask 108" on top of the selector 102' is also removed by the planarization process. The planarization step may be carried out using a chemical mechanical planarization (CMP) process. The memory cell pillar, which includes the magnetic memory element 100' formed on top of the first conductive line 104, the optional intermediate electrode 106' formed on top of the magnetic memory element 100', the selector 102' and the first protective sleeve 110''' surrounding the selector 102' formed on top of the optional intermediate electrode 106', is surrounded by the second protective sleeve 112', which is further surrounded by the first ILD 114'.

Figure 11:
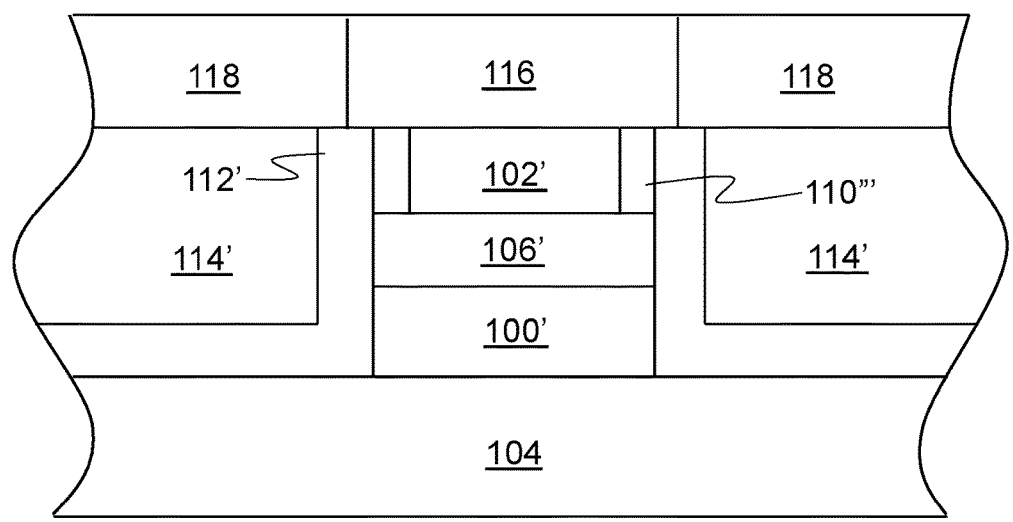

After the planarization step, a second conductive line 116, which is substantially perpendicular to the first conductive line 104, is formed on top of the selector 102' as illustrated in FIG. 11. The second conductive line 116 is surrounded by a second ILD 118. The second conductive line 116 may be fabricated by filling an etched trench in the second ILD 118 with a conductive material, a process commonly known as Damascene process. The second conductive line 116 may alternatively be fabricated by patterning a conductive layer deposited on top of the structure of FIG. 10. Like the first ILD 114', the second ILD 118 may be made of silicon oxide, silicon nitride, silicon oxynitride, or any dielectric material with a suitably small dielectric constant, such as but not limited to fluorine-doped silicon oxide, carbon-doped silicon oxide, or porous silicon.

Figure 12:
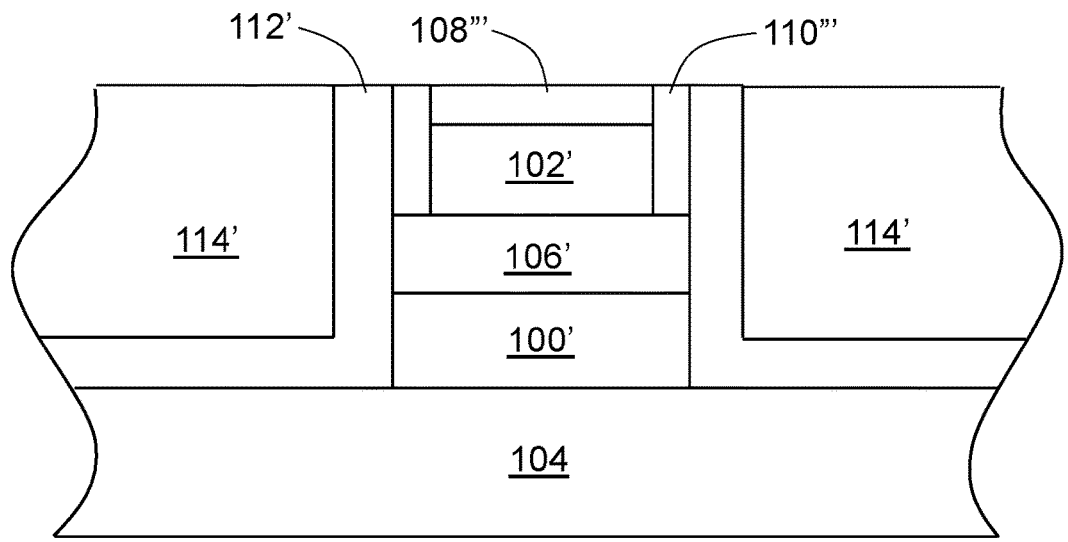
FIGS. 12 and 13 are cross sectional views illustrating various stages in formation of a memory cell in accordance with another method embodiment of the present invention.

In an alternative embodiment, following the deposition of the first dielectric material 114, as shown in FIG. 9, the planarization step proceeds by leaving at least a portion of the etch mask 108" intact on the selector 102' as illustrated in FIG. 12. The remaining etch mask 108''' on top of the selector 102' may be used to protect the selector 102' in subsequent process steps, especially if a Damascene process is used to fabricate a second conductive line above the selector 102'.

Figure 13:
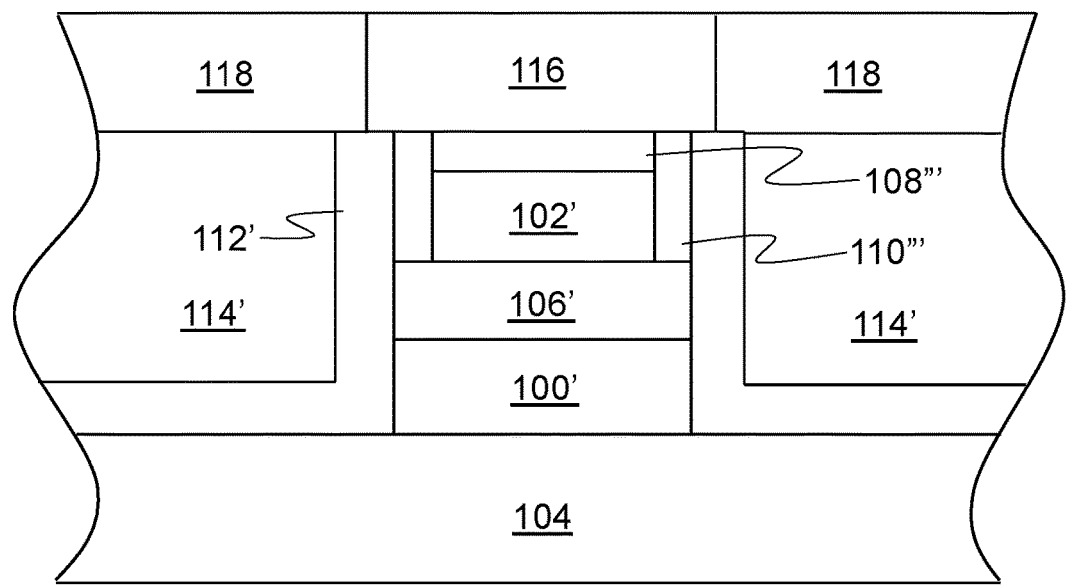

After the planarization step shown in FIG. 12, a second conductive line 116 is formed on top of the etch mask 108''' as illustrated in FIG. 13. The second conductive line 116 is substantially perpendicular to the first conductive line 104 and is surrounded by a second ILD 118. The second conductive line 116 may be fabricated by a conventional Damascene process or by patterning a conductive layer deposited on top of the structure of FIG. 12 as described above.

Figure 14:
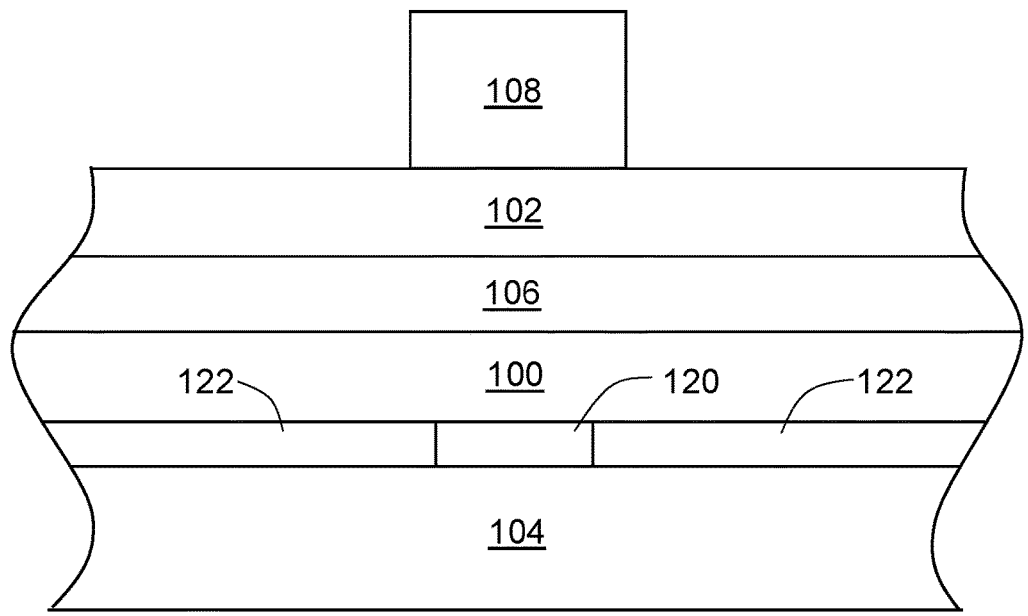
FIGS. 14 and 15 are cross sectional views illustrating various stages in formation of a memory cell in accordance with still another method embodiment of the present invention.

In another embodiment of the present invention as applied to formation of a magnetic memory cell, the process begins by forming a via 120 embedded in a dielectric layer 122 on top of one of the first conductive lines 104 as shown in FIG. 14. A magnetic memory element film stack 100 is then deposited on top of the via 120 and the dielectric layer. Compared with the structure illustrated in FIG. 3, the magnetic memory element film stack 100 is not in direct contact with the first conductive line 104, thereby minimizing the accumulation of metallic re-deposited materials on the sidewall of the magnetic memory element 100' during the memory cell pillar etching process illustrated in FIG. 7.

With continuing reference to FIG. 14, the deposition step continues by forming a selector film stack 102 on the magnetic memory element film stack 100. An optional intermediate electrode film stack 106 may be inserted between the magnetic memory element films stack 100 and the selector film stack 102. An etch mask 108, which may be vertically aligned to the via 120 beneath, is then formed on top of the selector film stack 102.

Figure 15:
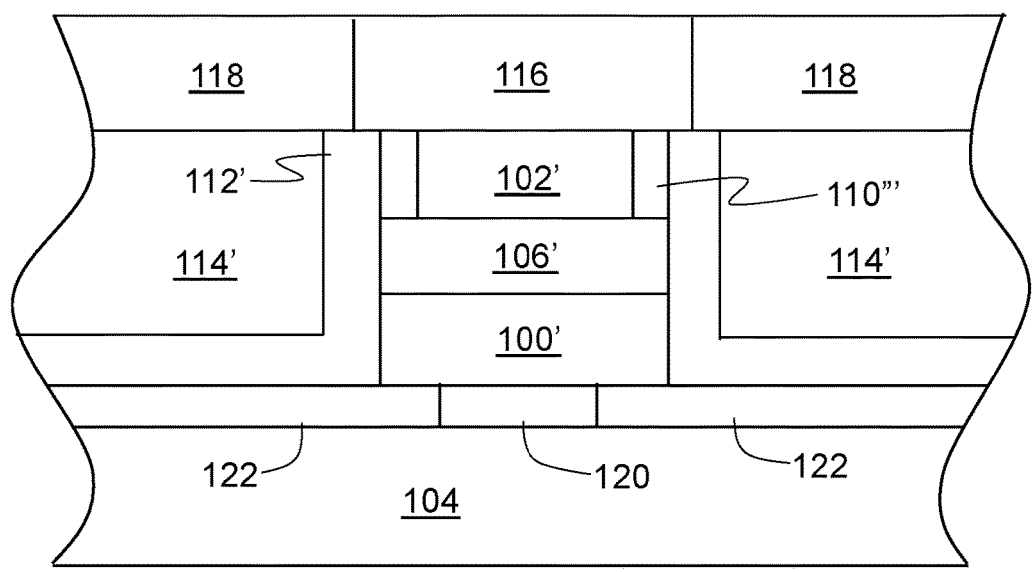

The fabrication process continues by following the steps illustrated in FIGS. 4-10 and described above, resulting in the structure shown in FIG. 15. In the drawing, numerals 100' to 118 denote the same components or substances as those shown for the embodiment in FIG. 11. Compared with the structure shown in FIG. 11, the magnetic memory element 100' is in direct contact with the via 120 rather than the first conductive line 104. In an embodiment, the top of the via 120 is completely covered by the magnetic memory cell comprising the magnetic memory element 100' and the selector 102'.

Figure 16:
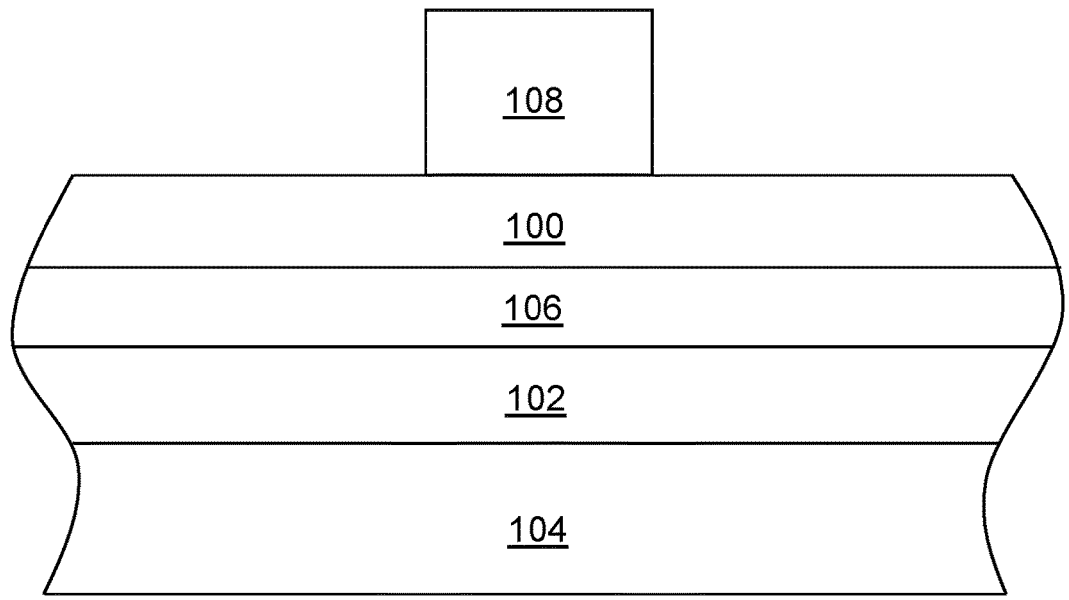
FIGS. 16 and 17 are cross sectional views illustrating various stages in formation of a memory cell in accordance with yet another method embodiment of the present invention.
Figure 17:
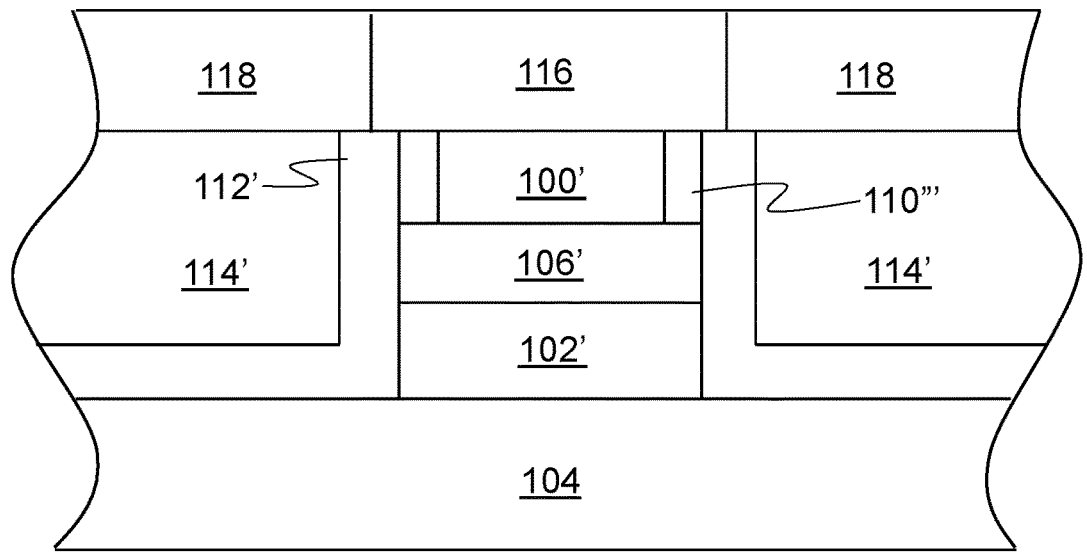

The stacking order of the magnetic memory element 100' and the selector 102', as shown in FIG. 11, may be reversed. The fabrication process for such a structure begins by depositing the selector films stack 102 on top of the substrate and the first conductive line 104 embedded therein, which is then followed by the deposition of the magnetic memory element films stack 100 as shown in FIG. 16. An optional intermediate electrode film stack 106 may be inserted between the magnetic memory element films stack 100 and the selector film stack 102. Following the deposition step, the process continues by following the steps illustrated in FIGS. 4-10 and described above, resulting in the structure shown in FIG. 17. In the drawing, numerals 100' to 118 denote the same components or substances as those shown for the embodiment in FIG. 11. The first protective sleeve 110''' is now used to protect the sidewall of the magnetic memory element 100' when etching the selector films stack 102 to form the memory cell pillar. Accordingly, the memory cell pillar, which includes the selector 102' formed on top of the first conductive line 104, the magnetic memory element 100' and the first protective sleeve 110''' surrounding the magnetic memory element 100' formed on top of the selector 102', is surrounded by the second protective sleeve 112', which is further surrounded by the first ILD 114'.

Figure 18A:
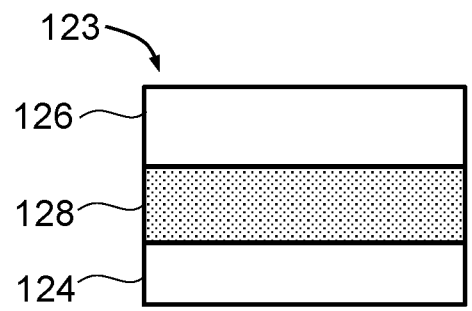
FIG. 18A is a cross sectional view of an exemplary structure for a two-terminal bi-directional selector in accordance with an embodiment of the present invention.

FIG. 18A shows a cross sectional view of an exemplary structure 123 for the selector 102', which may include a first electrode 124 and a second electrode 126 with a switching layer 128 interposed therebetween. Each of the first and second electrodes 124 and 126 may be made of a suitable conductor, such as but not limited to Cu, $CuGe_x$, Ni, Ag, Pt, Pd, Cr, Co, Fe, Al, Au, Ir, Ru, Ti, $TiN_x$, Ta, $TaN_x$, W, $WN_x$, Mo, $MoN_x$, Zr, $ZrN_x$, Hf, $HfN_x$, Nb, $NbN_x$, Zn, or any combination thereof. In an embodiment, the first and second electrodes 124 and 126 are made of a same material. In an alternative embodiment, the first and second electrodes 124 and 126 are made of different materials. For example, the first electrode 124 is made of silver (Ag) metal and the second electrode 126 is made of copper (Cu) or zinc (Zn) metal. The first and second electrodes 124 and 126 may have different thicknesses. In an embodiment, the first electrode 124 is thicker than the second electrode 126.

Figure 18B:
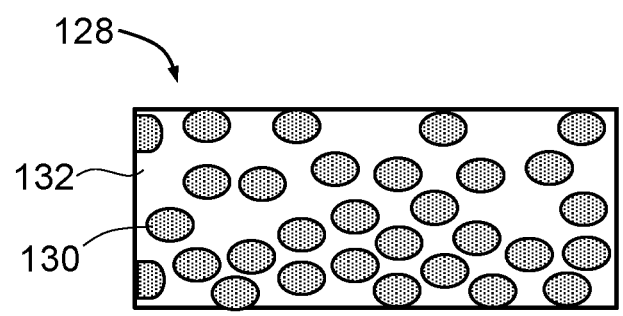
FIGS. 18B and 18C are cross sectional views of exemplary structures for the switching layer of the selector of FIG. 18A in accordance with an embodiment of the present invention.

The switching layer 128 may be made of a nominally insulating material or any suitable material that switches its resistance in the presence of an applied field or current, such as but not limited to $SiO_x$, $SiN_x$, $AlO_x$, $MgO_x$, $TaO_x$, $VO_x$, $NbO_x$, $TaO_x$, $TiO_x$, $WO_x$, $HfO_x$, $ZrO_x$, $NiO_x$, $FeO_x$, $YO_x$, $EuO_x$, $CuGe_xS_y$, $CuAgxGe_xS_z$, $GeSb_xTe_y$, $AgIn_xSb_yTe_z$, $GeTe_x$, $SbTe_x$, $GeSb_x$, $CrO_x$, $SrTi_xO_y$, or any combination thereof. The nominally insulating switching layer 128 may further include one or more metallic dopants, such as but not limited to Ag, Au, Zn, and Cu. Alternatively, the switching layer 128 may comprise a plurality of metal-rich clusters 130 embedded in a nominally semi-conducting or insulating matrix 132 as illustrated in FIG. 18B. The matrix 132 of the switching layer 128 may be made of a suitable stoichiometric or near-stoichiometric insulator compound, or a suitable non-stoichiometric insulator compound, or a suitable chalcogenide, or a suitable solid electrolyte, or any combination thereof. Examples of the suitable stoichiometric or near-stoichiometric insulator compound include silicon oxide ($SiO_2$), silicon nitride ($Si_3N_4$), aluminum oxide ($Al_2O_3$), magnesium oxide (MgO), tantalum oxide ($Ta_2O_5$), vanadium oxide ($V_2O_5$), niobium oxide ($Nb_2O_5$), titanium oxide ($TiO_2$), tungsten oxide ($WO_3$), hafnium oxide ($HfO_2$), zirconium oxide ($ZrO_2$), nickel oxides (NiO, $Ni_2O_3$), iron oxide ($Fe_2O_3$), yttrium oxide ($Y_2O_3$), europium oxide ($Eu_2O_3$), and any combinations thereof. Examples of the suitable non-stoichiometric oxide include $SiO_x$, $SiN_x$, $AlO_x$, $MgO_x$, $TaO_x$, $VO_x$, $NbO_x$, $TaO_x$, $TiO_x$, $WO_x$, $HfO_x$, $ZrO_x$, $NiO_x$, $FeO_x$, $YO_x$, $EuO_x$, and any combinations thereof. Examples of the suitable chalcogenide include GeTe, $Sb_2Te_3$, GeSb, $Ge_2Sb_2Te_5$, $GeSbTe_2$, $Sb_3Te_7$, and any combinations thereof. The suitable solid electrolyte for the matrix 132 may comprise one or more of the following elements: Ge, Sb, S, Se, In, Ga, Sn, As, and Te.

With continuing reference to FIG. 18B, the plurality of metal-rich clusters 130 may be made of a noble metal, or an alloy including one or more noble metals, or a fast electric field enhanced diffuser material, or any combination thereof. Examples of the noble metal include gold (Au), silver (Ag), platinum (Pt), palladium (Pd), rhodium (Rh), iridium (Ir), ruthenium (Ru), osmium (Os), and rhenium (Re). Examples of the fast electric field enhanced diffuser material include nickel (Ni), copper (Cu), silver (Ag), gold (Au), zinc (Zn), cobalt (Co), iron (Fe), tungsten (W), molybdenum (Mo), tantalum (Ta), niobium (Nb), aluminum (Al), titanium (Ti), zirconium (Zr), titanium nitride (TiN), zirconium nitride (ZrN), tantalum nitride (TaN), niobium nitride (NbN), and tungsten nitride (WN). In an embodiment, the plurality of metal-rich clusters 130 are made of a same material as at least one of the first and second electrodes 124 and 126.

Figure 18C:
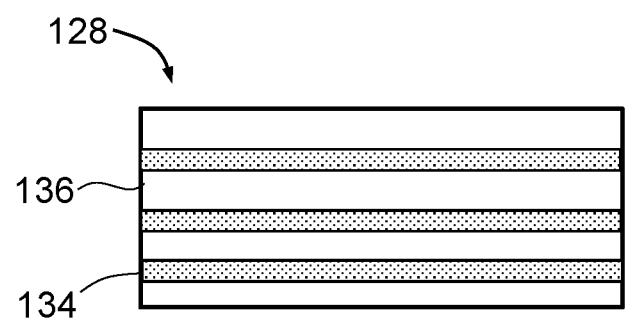

Still alternatively, the switching layer 128 may comprise one or more layers of a conductive material 134 interleaved with two or more layers of a nominally semi-conducting or insulating material 136 as illustrated in FIG. 18C. The conductive layers 134 may be made of any of the suitable conductive materials described above for the metal-rich clusters 130. The thickness of the conductive layers 134 may range from several angstroms to several nanometers. In some cases where the conductive layers 134 are extremely thin, one or more of the conductive layers 134 may be punctured by holes, thereby rendering the layer coverage to be discontinuous in some regions. Similarly, the nominally semi-conducting or insulating layers 136 may be made of any of the suitable semi-conducting or insulating materials described above for the matrix 132. In an embodiment, the conductive layers 134 are made of a same material as at least one of the first and second electrodes 124 and 126.

Figure 19A:
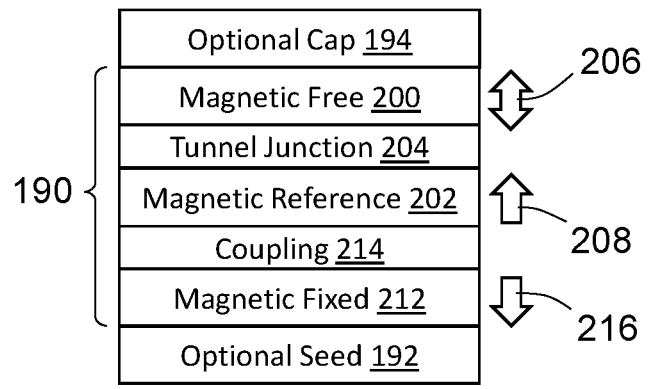
FIGS. 19A and 19B are cross sectional views of exemplary structures for a magnetic memory element in accordance with embodiments of the present invention.

FIG. 19A shows an exemplary structure for the magnetic memory element 100' that includes a magnetic tunnel junction (MTJ) structure 190 formed between an optional seed layer 192 and an optional cap layer 194. The MTJ structure 190 includes a magnetic free layer 200 and a magnetic reference layer 202 with an insulating tunnel junction layer 204 interposed therebetween. The magnetic free layer 200 has a variable magnetization direction 206 substantially perpendicular to the layer plane thereof. The magnetic reference layer 202 has a first fixed magnetization direction 208 substantially perpendicular to the layer plane thereof. The magnetic free layer 200, the tunnel junction layer 204, and the magnetic reference layer 202 collectively form an MTJ. The exemplary MTJ structure 190 may further include a magnetic fixed layer 212 exchange coupled to the magnetic reference layer 202 through an anti-ferromagnetic coupling layer 214. The magnetic fixed layer 212 has a second fixed magnetization direction 216 that is substantially perpendicular to the layer plane thereof and is substantially opposite to the first fixed magnetization direction 208 of the magnetic reference layer 202. Accordingly, the optional seed and cap layers 192 and 194, if present, may be formed adjacent to the magnetic fixed layer 212 and the magnetic free layer 200, respectively. In an embodiment, the stray magnetic fields exerted on the magnetic free layer 200 by the magnetic reference and fixed layers 202 and 212, respectively, substantially cancel each other, thereby rendering the offset field to be substantially zero or negligible. The stacking order of the layers 200-204, 212, 214 in the exemplary MTJ structure 190 may be inverted such that the optional cap and seed layers 194 and 192, if present, may be formed adjacent to the magnetic fixed layer 212 and the magnetic free layer 200, respectively.

Figure 19B:
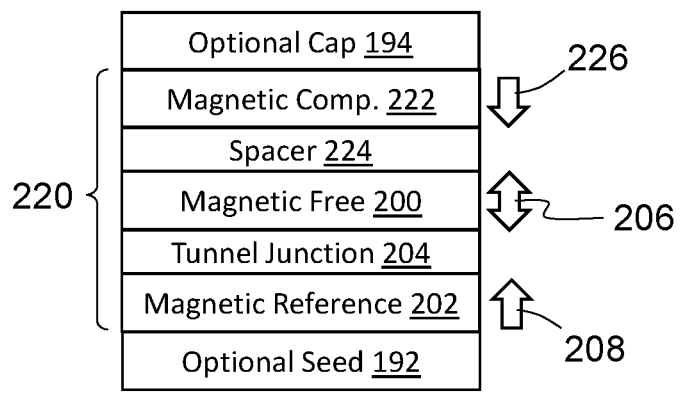

FIG. 19B shows another exemplary structure for the magnetic memory element 100' that includes another exemplary MTJ structure 220 formed between the optional seed and cap layers 192 and 194. The exemplary MTJ structure 220 includes a magnetic free layer 200 and a magnetic reference layer 202 with an insulating tunnel junction layer 204 interposed therebetween. The magnetic free layer 200 has a variable magnetization direction 206 substantially perpendicular to the layer plane thereof. The magnetic reference layer 202 has a first fixed magnetization direction 208 substantially perpendicular to the layer plane thereof. The exemplary MTJ structure 220 may further includes a magnetic compensation layer 222 separated from the magnetic free layer 200 by a non-magnetic spacer layer 224. The magnetic compensation layer 222 has a third fixed magnetization direction 226 that is substantially perpendicular to the layer plane thereof and is substantially opposite to the first fixed magnetization direction 208 of the magnetic reference layer 202. The magnetic compensation layer 222 is used to generate a magnetic field opposing that exerted by the magnetic fixed layer 202 on the magnetic free layer 200. Accordingly, the optional seed and cap layers 192 and 194, if present, may be formed adjacent to the magnetic reference layer 202 and the magnetic compensation layer 222, respectively. In an embodiment, the stray magnetic fields exerted on the magnetic free layer 200 by the magnetic reference and compensation layers 202 and 222, respectively, substantially cancel each other, thereby rendering the offset field to be substantially zero or negligible. The stacking order of the layers 200-204, 222, 224 in the exemplary MTJ structure 220 may be inverted such that the optional cap and seed layers 194 and 192, if present, may be formed adjacent to the magnetic reference layer 202 and the magnetic compensation layer 222, respectively.

The magnetic free layer 200, the magnetic reference layer 202, the magnetic fixed layer 212, and the magnetic compensation layer 222 of the above structures 190 and 220 may be made of any suitable magnetic material or structure. One or more of the magnetic layers 200, 202, 212, and 222 may comprise at least one ferromagnetic element, such as but not limited to cobalt (Co), nickel (Ni), or iron (Fe), to form a suitable magnetic material, such as but not limited to Co, Ni, Fe, CoNi, CoFe, NiFe, or CoNiFe. The magnetic material of the one or more of the magnetic layers 200, 202, 212, and 222 may further include one or more non-magnetic elements, such as but not limited to boron (B), titanium (Ti), zirconium (Zr), hafnium (Hf), vanadium (V), niobium (Nb), tantalum (Ta), chromium (Cr), molybdenum (Mo), tungsten (W), aluminum (Al), silicon (Si), germanium (Ge), gallium (Ga), oxygen (0), nitrogen (N), carbon (C), platinum (Pt), palladium (Pd), ruthenium (Ru), samarium (Sm), neodymium (Nd), antimony (Sb), iridium (Ir) or phosphorus (P), to form a magnetic alloy or compound, such as but not limited to cobalt-iron-boron (CoFeB), iron-platinum (FePt), cobalt-platinum (CoPt), cobalt-iron-boron-titanium (CoFeBTi), cobalt-iron-boron-zirconium, (CoFeBZr), cobalt-iron-boron-hafnium (CoFeBHf), cobalt-iron-boron-vanadium (CoFeBV), cobalt-iron-boron-tantalum (CoFeBTa), cobalt-iron-boron-chromium (CoFeBCr), cobalt-iron-titanium (CoFeTi), cobalt-iron-zirconium (CoFeZr), cobalt-iron-hafnium (CoFeHf), cobalt-iron-vanadium (CoFeV), cobalt-iron-niobium (CoFeNb), cobalt-iron-tantalum (CoFeTa), cobalt-iron-chromium (CoFeCr), cobalt-iron-molybdenum (CoFeMo), cobalt-iron-tungsten (CoFeW), cobalt-iron-aluminum (CoFeAl), cobalt-iron-silicon (CoFeSi), cobalt-iron-germanium (CoFeGe), iron-zirconium-boron (FeZrB), samarium-cobalt (SmCo), neodymium-iron-boron (NdFeB), cobalt-iron-antimony (CoFeSb), cobalt-iron-iridium (CoFeZr), or cobalt-iron-phosphorous (CoFeP).

Some of the above-mentioned magnetic materials, such as Fe, CoFe, CoFeB may have a body-centered cubic (BCC) lattice structure that is compatible with the halite-like cubic lattice structure of MgO, which may be used as the insulating tunnel junction layer 204. CoFeB alloy used for one or more of the magnetic layers 200, 202, 212, and 222 may contain more than 40 atomic percent Fe or may contain less than 30 atomic percent B or both.

One or more of the magnetic layers 200, 202, 212, and 222 may alternatively have a multilayer structure formed by interleaving one or more layers of a first type of material with one or more layers of a second type of material with at least one of the two types of materials being magnetic, such as but not limited to [Co/Pt], [Co/Pd], [Co/Pt(Pd)], [Co/Ni], [Co/Ir], [CoFe/Pt], [CoFe/Pd], [CoFe/Pt(Pd)], [CoFe/Ni], [CoFe/Ir], or any combination thereof. The multilayer structure may have a face-centered cubic (FCC) type of lattice structure, which is different from the body-centered cubic structure (BCC) of some ferromagnetic materials, such as Fe, CoFe, and CoFeB, and the halite-like cubic lattice structure of magnesium oxide (MgO) that may be used as the insulating tunnel junction layer 204. All individual magnetic layers of a magnetic multilayer structure may have the same magnetization direction. The multilayer structure may or may not exhibit the characteristic satellite peaks associated with superlattice when analyzed by X-ray, neutron diffraction, or other diffraction techniques.

Still alternatively, one or more of the magnetic layers 200, 202, 212, and 222 may comprise two, three, four, or more magnetic sublayers with each magnetic sublayer being made of any suitable magnetic material, including magnetic metal, alloy, compound, or multilayer structure as described in the preceding paragraphs above.

The anti-ferromagnetic coupling layer 214 of the exemplary MTJ structure 190 may be made of a suitable anti-ferromagnetic coupling material, such as but not limited to ruthenium (Ru), vanadium (V), niobium (Nb), tantalum (Ta), chromium (Cr), molybdenum (Mo), tungsten (W), manganese (Mn), rhenium (Re), osmium (Os), rhodium (Rh), iridium (Ir), copper (Cu), or any combination thereof.

The non-magnetic spacer layer 224 of the exemplary MTJ structure 220 may be made of any suitable non-magnetic material, such as but not limited to MgO, Ta, Hf, W, Mo, Ru, Pt, Pd, NiCr, NiTa, NiTi, or $TaN_x$.

The insulating tunnel junction layer 204 of the exemplary MTJ structures 190 and 220 may be formed of a suitable insulating material containing oxygen, nitrogen, or both, such as but not limited to magnesium oxide (MgO), aluminum oxide ($AlO_x$), titanium oxide ($TiO_x$), zirconium oxide ($ZrO_x$), hafnium oxide ($HfO_x$), vanadium oxide ($VO_x$), tantalum oxide ($TaO_x$), chromium oxide ($CrO_x$), molybdenum oxide ($MoO_x$), tungsten oxide ($WO_x$), silicon oxide ($SiO_x$), silicon nitride ($SiN_x$), or any combination thereof. The insulating tunnel junction layer 204 may have a halite-like cubic lattice structure.

The optional seed layer 192 of the exemplary structures for the magnetic memory element 100' illustrated in FIGS. 19A and 19B may have a single layer structure or may comprise two, three, four, or more sublayers formed adjacent to each other. One or more of the single layer and the multiple sublayers of the seed layer 192 comprise one or more of the following elements: B, Mg, Ti, Zr, Hf, V, Nb, Ta, Cr, Mo, W, Mn, Re, Fe, Ru, Os, Co, Rh, Ir, Ni, Pd, Pt, Cu, Ag, Au, Al, Si, Ge, Ga, O, N, and C. For example, the seed layer 192 may include a layer of MgO, Ta, Hf, W, Mo, Ru, Pt, Pd, NiCr, NiTa, NiTi, or $TaN_x$. Alternatively, the seed layer 192 may include a bilayer structure (Ru/Ta) comprising a Ta sublayer formed adjacent to one of the magnetic layers 212 and 202 and a Ru sublayer formed beneath the Ta sublayer. Other exemplary bilayer structures (bottom/top), such as Ta/Ru, Ta/Hf, Hf/Ta, Ta/W, W/Ta, W/Hf, Hf/W, Mo/Ta, Ta/Mo, Mo/Hf, Hf/Mo, Ru/W, W/Ru, MgO/Ta, Ta/MgO, Ru/MgO, Hf/MgO, and W/MgO, may also be used for the seed layer 192. Still alternatively, the seed layer 192 may include a bilayer structure comprising an oxide sublayer, such as MgO, formed adjacent to one of the magnetic layers 212 and 202 and an underlying, thin conductive sublayer, such as CoFeB which may be non-magnetic or amorphous or both. Additional seed sublayers may further form beneath the exemplary CoFeB/MgO seed layer to form other seed layer structures, such as but not limited to Ru/CoFeB/MgO, Ta/CoFeB/MgO, W/CoFeB/MgO, Hf/CoFeB/MgO, Ta/Ru/CoFeB/MgO, Ru/Ta/CoFeB/MgO, W/Ta/CoFeB/MgO, Ta/W/CoFeB/MgO, W/Ru/CoFeB/MgO, Ru/W/CoFeB/MgO, Hf/Ta/CoFeB/MgO, Ta/Hf/CoFeB/MgO, W/Hf/CoFeB/MgO, Hf/W/CoFeB/MgO, Hf/Ru/CoFeB/MgO, Ru/Hf/CoFeB/MgO, Ta/W/Ru/CoFeB/MgO, Ta/Ru/W/CoFeB/MgO, and Ru/Ta/Ru/CoFeB/MgO. Still alternatively, the seed layer 192 may include a multilayer structure formed by interleaving seed sublayers of a first type with seed sublayers of a second type. One or both types of the seed sublayers may comprise one or more ferromagnetic elements, such as Co, Fe, and Ni. For example, the seed layer 192 may be formed by interleaving layers of Ni with layers of a transition metal, such as but not limited to Ti, Zr, Hf, V, Nb, Ta, Cr, Mo, W, or any combination thereof. One or both types of seed sublayers may be amorphous or noncrystalline. For example, the first and second types of sublayers may respectively be made of Ta and CoFeB, both of which may be amorphous.

The optional cap layer 194 of the exemplary structures for the magnetic memory element 100' illustrated in FIGS. 19A and 19B may comprise two, three, four, or more sublayers formed adjacent to each other. One or more of the single layer and the multiple sublayers of the cap layer 194 may comprise one or more of the following elements: B, Mg, Ti, Zr, Hf, V, Nb, Ta, Cr, Mo, W, Mn, Re, Fe, Ru, Os, Co, Rh, Ir, Ni, Pd, Pt, Cu, Ag, Au, Al, Si, Ge, Ga, O, N, and C. For example, the cap layer 194 may include a layer of MgO, Ta, Hf, W, Mo, Ru, Pt, or Pd. Alternatively, the cap layer 194 may include a bilayer structure (W/Ta) comprising a W sublayer formed adjacent to one of the magnetic layers 200 and 222 and a Ta sublayer formed on top of the W sublayer. Other exemplary bilayer structures (bottom/top), such as Ta/Ru, Ru/Ta, Ta/Hf, Hf/Ta, Ta/W, Mo/Ta, Ta/Mo, W/Hf, Hf/W, Mo/Hf, Hf/Mo, Ru/W, W/Ru, MgO/Ta, Ta/MgO, MgO/Ru, MgO/Hf, and MgO/W, may also be used for the cap layer 194. Still alternatively, the cap layer 194 may include a bilayer structure comprising an oxide sublayer, such as MgO, formed adjacent to one of the magnetic layers 200 and 222 and a thin conductive sublayer, such as CoFeB which may be non-magnetic or superparamagnetic. Additional cap sublayers may further form on top of the exemplary MgO/CoFeB cap layer to form other cap layer structures, such as but not limited to MgO/CoFeB/Ru, MgO/CoFeB/Ta, MgO/CoFeB/W, MgO/CoFeB/Hf, MgO/CoFeB/Ru/Ta, MgO/CoFeB/Ta/Ru, MgO/CoFeB/W/Ta, MgO/CoFeB/Ta/W, MgO/CoFeB/W/Ru, MgO/CoFeB/Ru/W, MgO/CoFeB/Hf/Ta, MgO/CoFeB/Ta/Hf, MgO/CoFeB/Hf/W, MgO/CoFeB/W/Hf, MgO/CoFeB/Hf/Ru, MgO/CoFeB/Ru/Hf, MgO/CoFeB/Ru/W/Ta, MgO/CoFeB/W/Ru/Ta, and MgO/CoFeB/Ru/Ta/Ru. As such, the cap layer 194 may comprise an insulating cap sublayer and one or more conductive cap sublayers formed thereon.

Figure 20A:
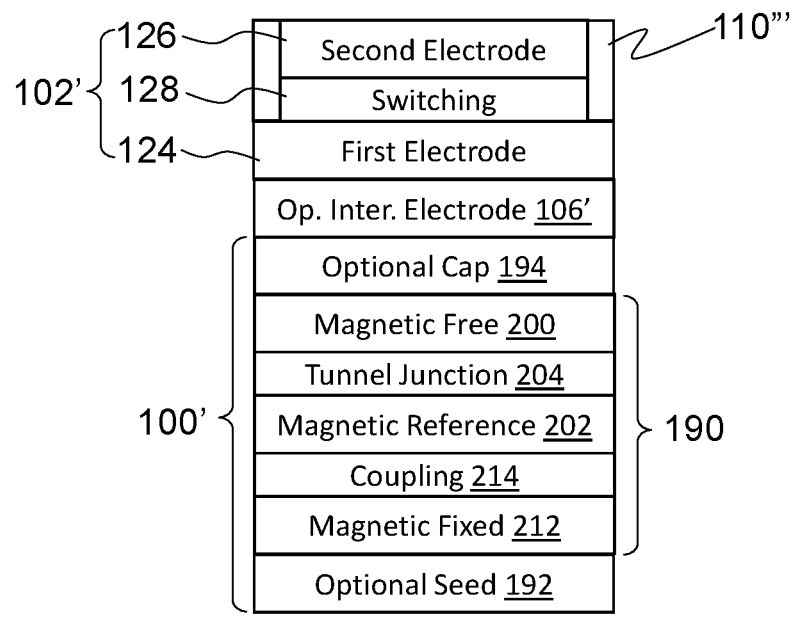
FIGS. 20A and 20B are cross sectional views of exemplary structures for a magnetic memory cell in accordance with embodiments of the present invention.

FIG. 20A is a cross sectional view of an exemplary magnetic memory cell with the selector 102' having the exemplary structure 123 shown in FIG. 18A disposed on top of the magnetic memory element 100' having the exemplary structure shown in FIG. 19A. The first electrode 124 of the selector 102' is formed adjacent to the magnetic free layer 200 or the optional cap layer 194 of the magnetic memory element 100'. Alternatively, the stacking order of the layers 200-204, 212, and 212 corresponding to the MTJ structure 190 may be inverted. In some embodiments, the memory cell of FIG. 20A includes the optional intermediate electrode 106' between the magnetic free layer 200/optional cap layer 194 and the first electrode 124.

The optional intermediate electrode 106' may include one or more electrode layers with each layer being made of a suitable material, such as but not limited to Ta, TaN, Ru, Ir, Rh, Ti, TiN, Zr, ZrN, Hf, HfN, V, VN, Nb, NbN, Cr, Mo, W, NiCr, FeNiCr, NiTi, NiTa, NiZr, NiHf, NiV, NiNb, NiMo, NiW, TiSi, NiSi, CoSi, CoCr, CoTi, CoTa, CoZr, CoHf, CoV, CoNb, CoMo, CoW, MgO, or any combination thereof. Each of the one or more electrode layers may alternatively have a multilayer structure with layers of a first material interleaved with layers of a second material. The first material may be Co or Ni and the second material may be Cr, Mo, W, Ta, Nb, V, Ti, Zr, Hf, Ir, or Rh. For example, the intermediate electrode 106' may include an MgO layer formed adjacent to the magnetic free layer 200 or the optional cap layer 194 and a ruthenium (Ru) layer formed adjacent to the first electrode 124. Alternatively, the optional intermediate electrode 106' may include a tantalum layer formed adjacent to the first electrode 124 and a ruthenium layer formed adjacent to the magnetic free layer 200 or the optional cap layer 194. Still alternatively, the optional intermediate electrode 106' may include multiple layers with an MgO layer formed adjacent to the magnetic free layer 200. Yet alternatively, the optional intermediate electrode 106' may include a layer of tantalum nitride (TaN) or titanium nitride (TiN).

The exemplary magnetic memory cell of FIG. 20A may be fabricated in accordance with the method embodiment illustrated in FIGS. 3-11 and described above. In an alternative embodiment, the first protective sleeve 110''' completely surrounds the sidewall of the switching layer 128 but does not fully extend downward to cover the sidewall of the entire selector 102', which includes the first electrode 124 disposed below the switching layer 128, as shown in FIG. 20A. Such a structure may be fabricated by modifying the step of etching the selector film stack 102 with the etch mask 108 thereon as illustrated in FIG. 4 by stopping the etching process after the removal of the switching layer film, followed by depositing the first conformal protective layer 110 on top of the first electrode film. In other embodiments, the sidewall coverage of the first protective layer 110''' may extend from the switching layer 128 downward to cover the optional intermediate electrode 106' or even a part of the magnetic memory element 100' by modifying the etching step illustrated in FIG. 4 accordingly. For example, the first protective sleeve 110''' may be extended to fully cover the sidewall of the optional intermediate electrode 106' by etching away the optional intermediate electrode film stack 106 at the etching step shown in FIG. 4, followed by depositing the first conformal protective layer 110 on top of the magnetic memory element film stack 100.

Figure 20B:
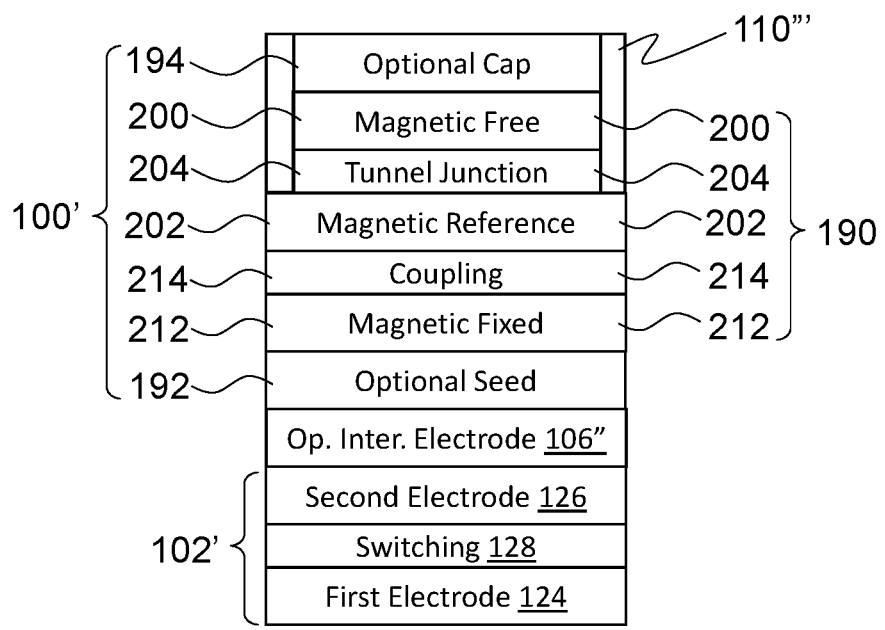

FIG. 20B is a cross sectional view of another exemplary magnetic memory cell with the magnetic memory element 100' having the exemplary structure shown in FIG. 19A disposed on top of the selector 102' having the exemplary structure 123 shown in FIG. 18A. The second electrode 126 of the selector 102' is formed adjacent to the magnetic fixed layer 212 or the optional seed layer 192 of the magnetic memory element 100'. Alternatively, the stacking order of the layers 200-204, 212, and 214 corresponding to the MTJ structure 190 may be inverted. In some embodiments, the memory cell of FIG. 20B includes the optional intermediate electrode 106" between the magnetic fixed layer 212/optional seed layer 192 and the second electrode 126.

The optional intermediate electrode 106" may include one or more electrode layers with each layer being made of a suitable material, such as but not limited to Ta, TaN, Ru, Ir, Rh, Ti, TiN, Zr, ZrN, Hf, HfN, V, VN, Nb, NbN, Cr, Mo, W, NiCr, FeNiCr, NiTi, NiTa, NiZr, NiHf, NiV, NiNb, NiMo, NiW, TiSi, NiSi, CoSi, CoCr, CoTi, CoTa, CoZr, CoHf, CoV, CoNb, CoMo, CoW, MgO, or any combination thereof. Each of the one or more electrode layers may alternatively have a multilayer structure with one or more layers of a first material interleaved with one or more layers of a second material. The first material may be Co or Ni and the second material may be Cr, Mo, W, Ta, Nb, V, Ti, Zr, Hf, Ir, or Rh. For example, the optional intermediate electrode 106" may include a tantalum layer formed adjacent to the second electrode 126 and a [Co/Ni] multilayer structure formed adjacent to the magnetic fixed layer 212. Alternatively, the optional intermediate electrode 106" may include a tantalum layer formed adjacent to the second electrode 126 and a NiCr layer formed adjacent to the magnetic fixed layer 212. Still alternatively, the optional intermediate electrode 106" may include a layer of tantalum nitride (TaN) or titanium nitride (TiN).

The exemplary magnetic memory cell of FIG. 20B may be fabricated in accordance with the method embodiment illustrated in FIGS. 16, 4-10, 17 and described above. In an alternative embodiment, the first protective sleeve 110''' completely surrounds the sidewall of the insulating tunnel junction layer 204 but does not fully extend downward to cover the sidewall of the entire magnetic memory element 100', as shown in FIG. 20B. Such a structure may be fabricated by modifying the step of etching the magnetic memory element film stack 100 with the etch mask 108 thereon by stopping the etching process after the removal of the insulating tunnel junction film, followed by depositing the first conformal protective layer 110 on top of the magnetic reference layer film. In other embodiments, the sidewall coverage of the first protective layer 110''' may extend from the insulating tunnel junction 204 downward to cover the optional intermediate electrode 106" or even a part of selector 102' by modifying the etching step accordingly. For example, the first protective sleeve 110''' may be extended to fully cover the sidewall of the optional intermediate electrode 106" by etching away the optional intermediate electrode film stack 106 using the etch mask 108, followed by depositing the first conformal protective layer 110 on top of the selector film stack 102.

While the present invention has been shown and described with reference to certain preferred embodiments, it is to be understood that those skilled in the art will no doubt devise certain alterations and modifications thereto which nevertheless include the true spirit and scope of the present invention. Thus the scope of the invention should be determined by the appended claims and their legal equivalents, rather than by examples given.

Any element in a claim that does not explicitly state "means for" performing a specified function, or "step for" performing a specific function, is not to be interpreted as a "means" or "step" clause as specified in 35 U.S.C. § 112, ¶ 6. In particular, the use of "step of" in the claims herein is not intended to invoke the provisions of 35 U.S.C. § 112, ¶ 6.

What is claimed is:

1. A method for manufacturing a memory cell that includes a magnetic memory element electrically connected to a selection element comprising a two-terminal selector, the method comprising the steps of:
    depositing a selector film stack for the two-terminal selector on a substrate;
    depositing a magnetic memory element film stack for the magnetic memory element on top of the selector film stack, the magnetic memory element film stack including a magnetic reference layer film and a magnetic free layer film with an insulating tunnel junction layer film interposed therebetween;
    etching the magnetic memory element film stack with an etch mask formed thereon to remove at least a first portion of the insulating tunnel junction layer film not covered by the etch mask to form a magnetic memory element pillar that includes a second portion of the insulating tunnel junction layer film;
    depositing a first conforming dielectric layer over the magnetic memory element pillar, including a sidewall thereof, and surrounding surface;
    etching a portion of the first conforming dielectric layer covering the surrounding surface to form a first protective sleeve around at least the second portion of the insulating tunnel junction layer film of the magnetic memory element pillar; and
    etching the selector film stack using the etch mask and the first protective sleeve as a composite mask to form a memory cell pillar.

2. The method of claim 1, wherein the substrate includes therein a conductive line electrically connected to the memory cell pillar, the conductive line extending along a direction parallel to a substrate surface.

3. The method of claim 1, wherein the substrate includes a via embedded in a dielectric matrix, the via being connected to the memory cell pillar above and a conductive line below, the conductive line extending along a direction parallel to a substrate surface.

4. The method of claim 3, wherein top of the via is fully covered by the memory cell pillar.

5. The method of claim 1, wherein the first protective sleeve is made of a compound comprising silicon and nitrogen.

6. The method of claim 1, wherein all layers of the magnetic memory element film stack not covered by the etch mask are removed during the step of etching the magnetic memory element film stack.

7. The method of claim 1, further comprising the step of depositing a second conforming dielectric layer over the memory cell pillar and the first protective sleeve to form a second protective sleeve.

8. The method of claim 7, wherein the second protective sleeve is made of a compound comprising silicon and nitrogen.

9. The method of claim 7, wherein the second protective sleeve is made of an oxide.

10. The method of claim 7, further comprising the step of forming an interlayer dielectric layer surrounding the second protective sleeve.

11. The method of claim 7, further comprising the step of forming a conductive line connected to the memory cell pillar from above, the conductive line extending along a direction parallel to a substrate surface.

* * * * *